(12) United States Patent
Jeon et al.

(10) Patent No.: US 12,022,621 B2
(45) Date of Patent: Jun. 25, 2024

(54) PRINTED CIRCUIT BOARD AND METHOD FOR MANUFACTURING THE SAME

(71) Applicant: SAMSUNG ELECTRO-MECHANICS CO., LTD., Suwon-si (KR)

(72) Inventors: Mi Jeong Jeon, Suwon-si (KR); Tae Hee Yoo, Suwon-si (KR); Hyun Seok Yang, Suwon-si (KR); In Jae Chung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 222 days.

(21) Appl. No.: 17/869,035

(22) Filed: Jul. 20, 2022

(65) Prior Publication Data
US 2023/0337367 A1 Oct. 19, 2023

(30) Foreign Application Priority Data
Apr. 15, 2022 (KR) .................. 10-2022-0046788

(51) Int. Cl.
| | |
|---|---|
| H05K 1/02 | (2006.01) |
| G03F 7/00 | (2006.01) |
| H05K 1/11 | (2006.01) |
| H05K 3/10 | (2006.01) |
| H05K 3/18 | (2006.01) |

(52) U.S. Cl.
CPC ......... *H05K 3/108* (2013.01); *G03F 7/70466* (2013.01); *H05K 1/0296* (2013.01); *H05K 1/111* (2013.01); *H05K 3/184* (2013.01); *H05K 2201/09845* (2013.01); *H05K 2203/0588* (2013.01); *H05K 2203/072* (2013.01); *H05K 2203/0723* (2013.01)

(58) Field of Classification Search
CPC ......... H05K 1/0296; H05K 2203/0588; H05K 2203/0577
See application file for complete search history.

(56) References Cited

U.S. PATENT DOCUMENTS

| | | | | |
|---|---|---|---|---|
| 2006/0079081 A1* | 4/2006 | Hsu | ........................ | H05K 3/243 438/618 |
| 2013/0161085 A1* | 6/2013 | Oh | .................... | H01L 23/49811 174/267 |
| 2013/0168144 A1* | 7/2013 | Jeong | ................... | H05K 3/4015 228/198 |
| 2014/0239490 A1* | 8/2014 | Wang | ................ | H01L 23/49822 257/737 |

FOREIGN PATENT DOCUMENTS

| | | |
|---|---|---|
| JP | 2011-204730 A | 10/2011 |
| JP | 2014-011402 A | 1/2014 |
| KR | 10-1255954 B1 | 4/2013 |

* cited by examiner

*Primary Examiner* — Sherman Ng
(74) *Attorney, Agent, or Firm* — Morgan, Lewis & Bockius LLP

(57) ABSTRACT

A method of manufacturing a printed circuit board includes: forming first and second resist films, respectively having first and second openings exposing a first metal layer disposed on one surface of an insulating layer; forming a second metal layer on the first metal layer, exposed through the first and second openings, to fill at least a portion of each of the first and second openings; and removing the first and second resist films. The first and second openings have different widths in a cross-section.

16 Claims, 44 Drawing Sheets

PRINTED CIRCUIT BOARD AND METHOD FOR MANUFACTURING THE SAME

CROSS-REFERENCE TO RELATED APPLICATION(S)

This application claims benefit of priority to Korean Patent Application No. 10-2022-0046788 filed on Apr. 15, 2022 in the Korean Intellectual Property Office, the disclosure of which is incorporated herein by reference in its entirety.

TECHNICAL FIELD

The present disclosure relates to a printed circuit board and a method of manufacturing the same.

BACKGROUND

With the development of technology for mobile application processors (APs), or the like, semiconductors have been highly integrated. In this regard, a method of performing die-to-die interconnection by applying microprocesses to a printed circuit board is attracting attention as a method of reducing costs. A structure, in which a metal post is formed in a bump connection region of an outermost layer of a printed circuit board to secure reliability between a bump and a pad when a microcircuit for die connection is formed on the outermost layer, has been developed. However, in a structure according to the related art, a metal post is additionally formed using dry resist after a pad is formed, resulting in a quality issue caused by a limitation in process distribution associated with matching force between a metal post and a pad.

SUMMARY

An aspect of the present disclosure is to provide a printed circuit board, capable of suppressing a risk of mismatch between a metal post and a pad, and a method of manufacturing the same.

The present disclosure provides various solutions. As one solution, a metal post and a pad may be simultaneously formed by performing a plating process only once through a method using a plurality of resist films to suppress an interlayer matching risk.

According to an aspect of the present disclosure, a method of manufacturing a printed circuit board includes: forming first and second resist films, respectively having first and second openings exposing a first metal layer disposed on one surface of an insulating layer; forming a second metal layer on the first metal layer, exposed through the first and second openings, to fill at least a portion of each of the first and second openings; and removing the first and second resist films. The first and second openings have different widths in a cross-section.

According to another aspect of the present disclosure, a printed circuit board includes: an insulating layer; a seed metal layer disposed on the insulating layer; and a metal post including a first metal portion, disposed on the seed metal layer, and a second metal portion disposed on the first metal portion. The first and second metal portions are integrated with each other without a boundary therebetween. The first and second metal portions have different widths in a cross-section. The seed metal layer is in contact with the first metal layer, but is spaced apart from the second metal layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure will be described as follows with reference to the attached drawings.

Electronic Device

Figure 1:
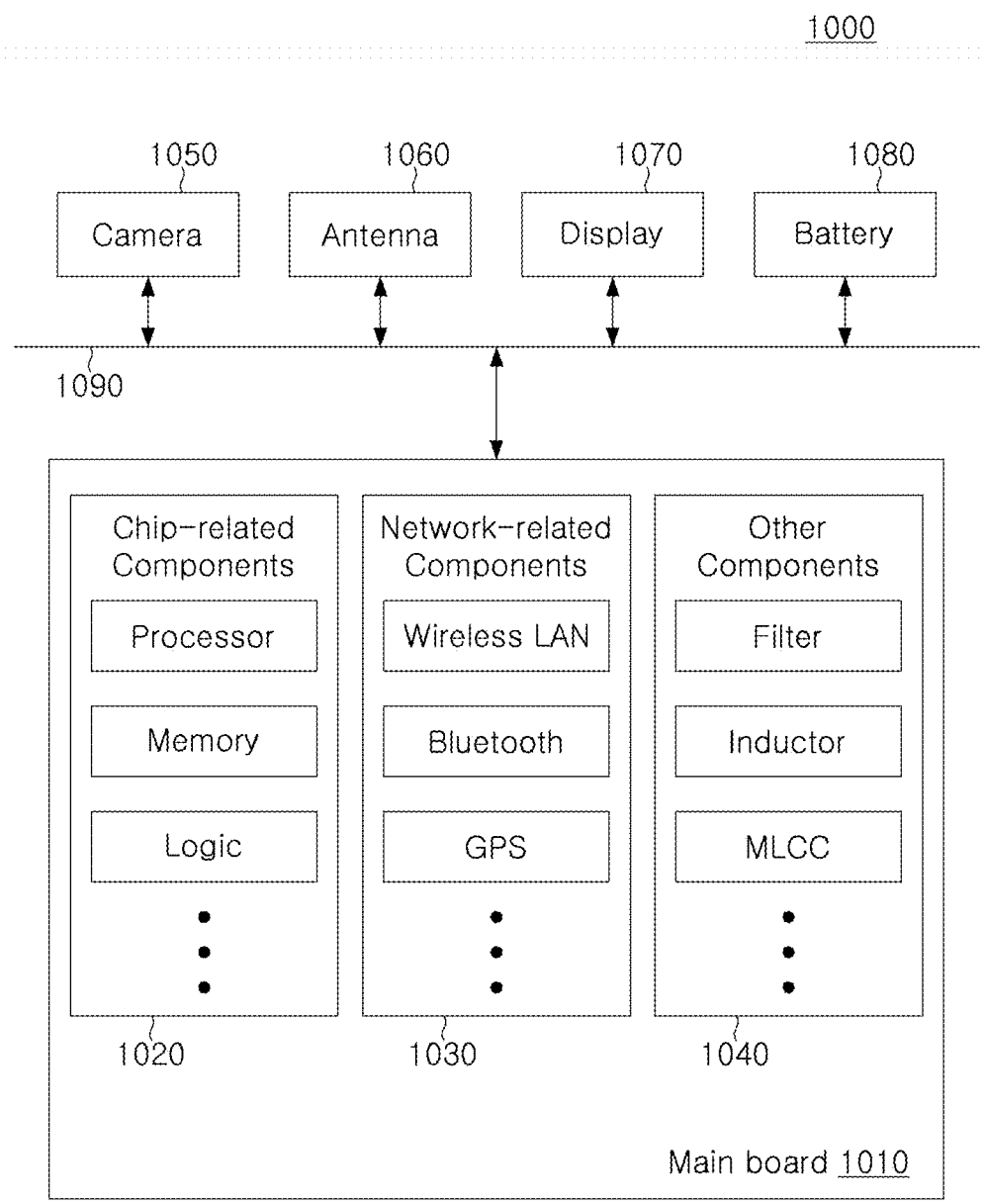
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, physically and/or electrically connected thereto. These components may be connected to other electronic components to be described below to form various signal lines 1090.

The chip-related components 1020 may include a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+(HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
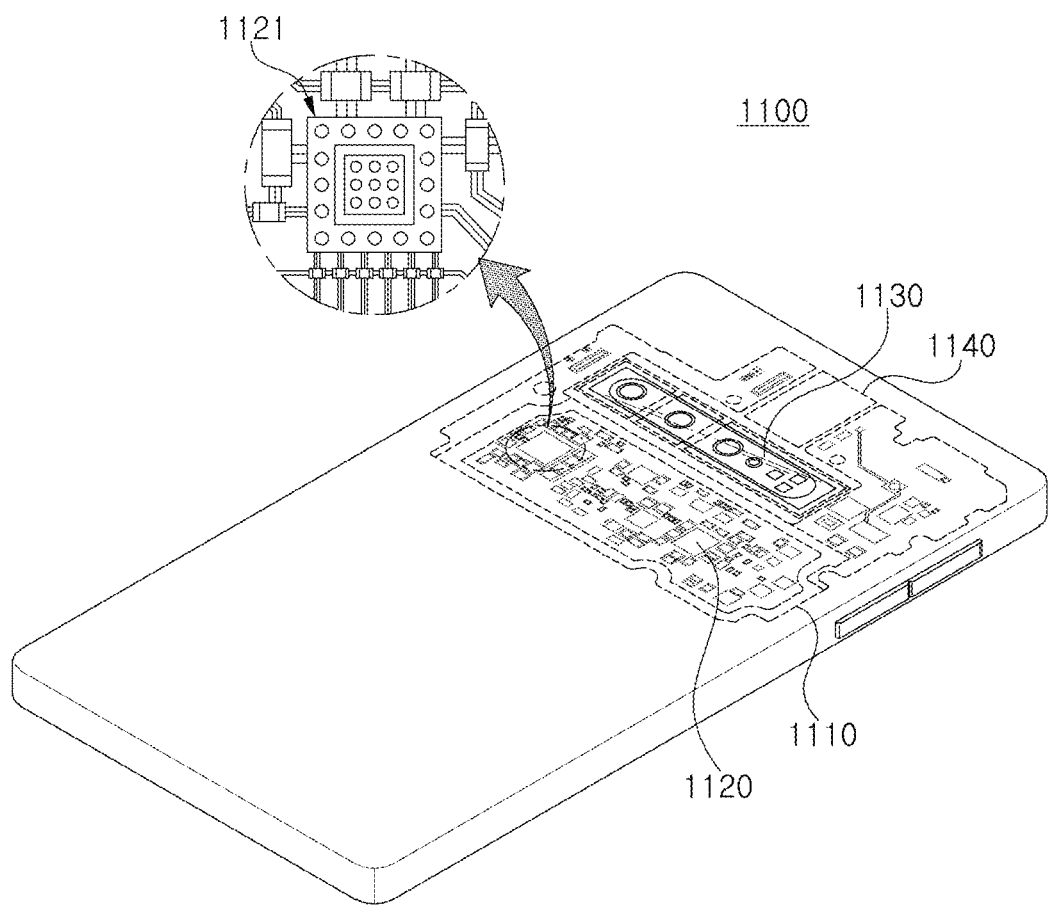
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted, but is not limited thereto. Alternatively, the component package 1121 may be in the form of a printed circuit board in which active components and/or passive components are embedded. Meanwhile, the electronic device is not necessarily limited to the smartphone 1100, but may be any other electronic device as described above.

Printed Circuit Board

Figure 3:
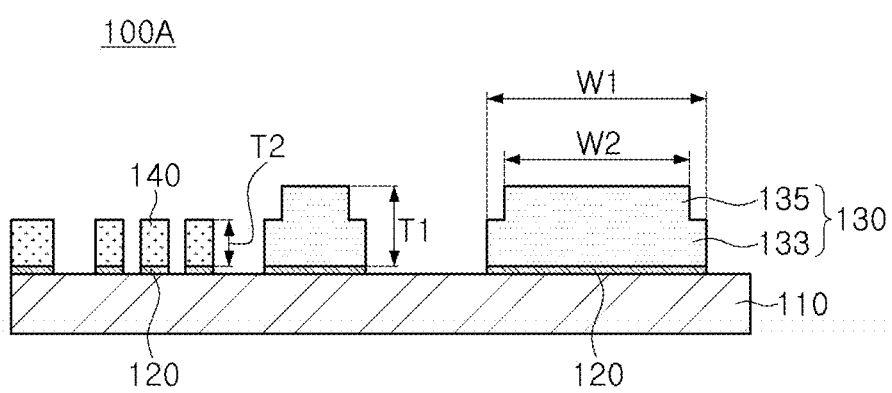
FIG. 3 is a schematic cross-sectional view illustrating an example of a printed circuit board.

FIG. 3 is a schematic cross-sectional view illustrating an example of a printed circuit board.

Referring to FIG. 3, a printed circuit board 100A according to an example may include an insulating layer 110, a seed metal layer 120 disposed on the insulating layer 110, and a metal post 130 including a first metal portion 133 disposed on the seed metal layer 120 and a second metal portion 135 disposed on the first metal portion 133. As necessary, the printed circuit board 100A according to an example may further include a metal pattern 140 disposed on the seed metal layer 120.

The first and second metal portions 133 and 135 of the metal post 130 may be integrated with each other without a boundary therebetween, and may have different widths in a cross-section. As an example, a width W1 of the first metal portion 133 in the cross-section may be greater than a width W2 of the second metal portion 135 in the cross-section. When widths in the cross-section are not constant, average widths may be compared with each other. The seed metal layer 120 may be in contact with the first metal portion 133, and may be spaced apart from the second metal portion 135. Such a structural feature may allow a risk of mismatch between a metal post and a pad, an issue in the related art, to be addressed.

A thickness T2 of the metal pattern 140 in the cross-section may be smaller than a thickness T1 of the metal post 130 in the cross-section. As described above, the metal pattern 140 may be a microcircuit pattern, and the metal post 130 may be formed by integrating a pad portion of the microcircuit pattern with the post portion. A portion of the metal pattern 140 may be used as a mark for matching a plurality of layers of resist films for forming the metal posts 130.

The second metal portion 135 of the metal post 130 may have a tapered side surface in the cross-section. For example, the second metal portion 135 may have a tapered side surface in which a width of an upper side is greater than a width of a lower side in the cross-section. However, examples embodiments are not limited thereto.

Hereinafter, components of the printed circuit board 100A according to an example will be described in more detail with reference to accompanying drawings.

The insulating layer 110 may include an insulating material. The Insulating material may a thermosetting resin such as an epoxy resin, a thermoplastic resin such as a polyimide resin, or a material including an inorganic filler, an organic filler, and/or a glass fiber, glass cloth and/or glass fabric together with the thermosetting or thermoplastic resin. The insulating material may be a photosensitive material and/or a non-photosensitive material. For example, the applicable insulating material may be solder resist (SR), Ajinomoto build-up film (ABF), prepreg (PPG), resin coated copper (RCC), copper clad laminate (CCL), or the like, but is not limited thereto. As an insulating material, another type of polymer material may be used.

The seed metal layer 120 may include a metal material. The metal material may include copper (Cu), aluminum (Al), silver (Ag), tin (Sn), gold (Au), nickel (Ni), lead (Pb), titanium (Ti), and/or alloys thereof. The seed metal layer 120 may be relatively thinner than the metal posts 130 and the metal pattern 140, and may be an electroless plating layer (or chemical copper). However, example embodiments are not limited thereto, and the seed metal layer 120 may be copper foil, or the like.

The metal post 130 may include a metal material. The first and second metal portions 133 and 135 of the metal post 130 may include the same metal material. The metal material may include copper (Cu), aluminum (Al), silver (Ag), tin (Sn), gold (Au), nickel (Ni), lead (Pb), titanium (Ti), and/or alloys thereof. The metal post 130 may perform various functions depending on a design thereof. For example, the metal post 130 may include a ground post, a power post, a signal post, and the like. The signal post may include a post for electrical connection of various signals, for example, data signals, other than ground signals, power signals, and the like. The metal post 130 may be an electrolytic plating layer (or electrical copper). In this case, the first and second metal portions 133 and 135 may be simultaneously formed by plating.

The metal pattern 140 may include a metal material. The metal material may include copper (Cu), aluminum (Al), silver (Ag), tin (Sn), gold (Au), nickel (Ni), lead (Pb), titanium (Ti), and/or alloys thereof. The metal pattern may perform various functions depending on a design thereof. For example, the metal pattern 140 may be ground patterns, power patterns, or signal patterns. The signal patterns may include various signals, for example, data signals, other than ground patterns, power patterns, and the like. Each of the patterns may include a line pattern, a plane pattern, and/or a pad pattern. The metal pattern 140 may be an electrolytic plating layer (or electrical copper).

The printed circuit board 100A according to an example may be applied not only to such a single-layer substrate but also to a multilayer substrate, for example, the insulating layer 110, the seed metal layer 120, the metal post 130, and the metal pattern 140 described above may be applied to an outermost layer of the multilayer substrate. For example, the printed circuit board 100A according to an example may be applied to a multi-chip package, in which reliability of a bump and a copper pad is secured by forming a copper post in a bump connection region of an outermost layer of a multilayer printed circuit board for signal connection between multiple dies including highly integrated microcircuits, or the like.

FIGS. 4A to 4G are schematic process views illustrating an example of manufacturing a metal post of the printed circuit board of FIG. 3.

Figure 4A:
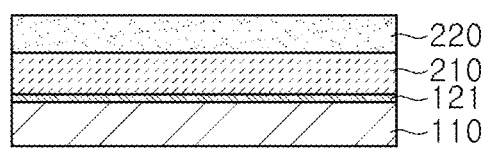
FIGS. 4A to 4G are schematic process views illustrating an example of manufacturing a metal post of the printed circuit board of FIG. 3.

Referring to FIG. 4A, an insulating layer 110, having one surface on which a first metal layer 121 is disposed, may be prepared. The first metal layer 121 may be formed by electroless plating (or chemical plating). Alternatively, the first metal layer 121 may be formed by laminating a copper foil, or the like, on one surface of the insulating layer 110. Next, first and second resist films 210 and 220 may be formed on the first metal layer 121. The first and second resist films 210 and 220 may be formed by a double-laminating method. For example, the first and second resist films 210 and 220 may be continuously laminated on the first metal layer 121. Alternatively, the first and second resist films 210 and 220 may be laminated in advance using a temporary film and then laminated on the first metal layer 121 together, and the temporary film may be removed. The first resist film 210 may include a non-photosensitive material, while the second resist film 220 may include a photo-sensitive material. The first resist film 210 may be, for example, a non-photosensitive film including an acrylic resin, but is not limited thereto. The second resist film 220 may be, for example, a negative-type resist film, but is not limited thereto.

Figure 4B:
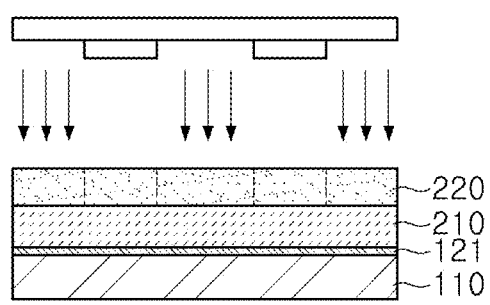

Referring to FIG. 4B, a portion of the second resist film 220 may be exposed. A mask may be used in the exposure process of the second resist film 220. For example, when the second resist film 220 is a negative-type resist film, a region, not covered with a mask, may be partially exposed to be selectively cured.

Figure 4C:
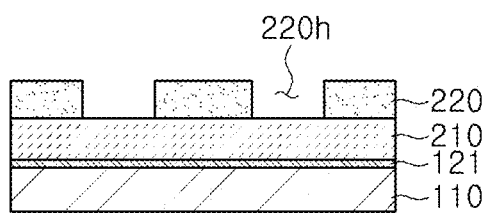

Referring to FIG. 4C, the exposed second resist film 220 may be developed to form a second opening 220h. For example, when the second resist film 220 is a negative-type resist film, an unexposed region may be developed by a development process. As a result of the development, a second opening 220h may be formed. The second opening 220h may have a tapered side surface in a cross-section. For example, the second opening 220h may have a tapered side surface, in which a width of an upper side is greater than a width of to lower side, in the cross-section. However, example embodiments are not limited thereto.

Figure 4D:
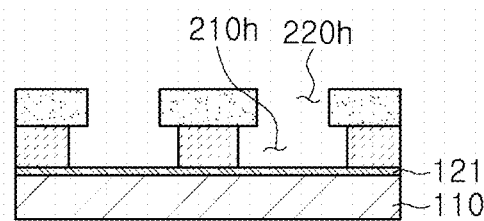

Referring to FIG. 4D, the first resist film 210 exposed through the second opening 220h may be developed to form the first opening 210h. The first resist film 210 may react only with, for example, sodium carbonate and may control development time to adjust a development area. For example, the first opening 210h may be formed to have a width, different from a width of the second opening 220h, in a cross-section. For example, the first opening 210h may be formed to have a width, greater than a width of the second opening 220h, in the cross-section, but example embodiments are not limited thereto. When widths in the cross-section are not constant, average widths may be compared with each other.

Figure 4E:
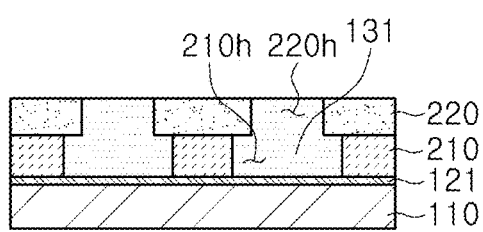

Referring to FIG. 4E, a second metal layer 131 may be formed on the first metal layer 121, exposed through the first and second openings 210h and 220h, to fill at least a portion of each of the first and second openings 210h and 220h. The second metal layer 131 may be formed by electrolytic plating (or electroplating). The second metal layer 131 may simultaneously fill the first and second openings 210h and 220h.

Figure 4F:
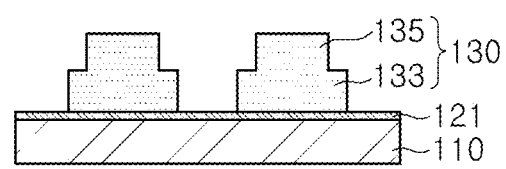

Referring to FIG. 4F, the first and second resist films 210 and 220 may be removed. For example, the first and second resist films 210 and 220 may be removed in a peeling process. When the first and second resist films 210 and 220 are removed, a metal post 130 made of the second metal layer 131 and having a form, in which the first and second metal portions 133 and 135 are integrated with each other, may be formed on the first metal layer 121.

Figure 4G:
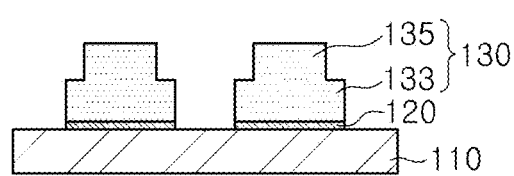

Referring to FIG. 4G, at least a region of the first metal layer 121 may be etched. For example, a region of the first metal layer 121, in which the metal post 130 is not formed, may be etched to be removed. As a result, a seed metal layer 120 made of the first metal layer 121 may be formed between the insulating layer 110 and the metal post 130.

The metal post 130 of the above-described printed circuit board 100A according to an example may be formed through a series of process operations. When such a process is used, a resist film having a high thickness may be provided through a plurality of resist films to overcome insufficiency of an exposure margin. In addition, after the plurality of resist films are developed, a plurality of metal portions of a metal post may be simultaneously formed by performing a plating process only once, and thus, a matching issue in the related art may also be addressed.

FIGS. 5A to 5F are schematic process views illustrating an example of manufacturing the printed circuit board of FIG. 3.

Figure 5A:
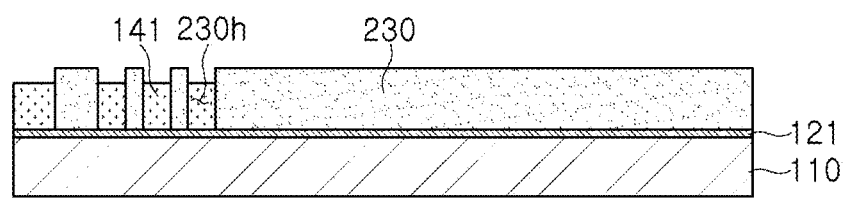
FIGS. 5A to 5F are schematic process views illustrating an example of manufacturing the printed circuit board of FIG. 3.

Referring to FIG. 5A, an insulating layer 110, having one surface on which a first metal layer 121 is disposed, may be prepared, and a third resist film 230, having a third opening 230h exposing the first metal layer 121, may be formed on the first metal layer 121. For example, a third resist film 230 may be formed on the first metal layer 121 by a film lamination method, or the like, a portion of the third resist film 230 may be exposed using a mask, and the exposed third resist film 230 may then be developed to form a third opening 230h. The third resist film 230 may include a photosensitive material and may be, for example, a negative-type resist film, but is not limited thereto. Next, a third metal layer 141 may be formed on the first metal layer 121, exposed through the third opening 230h, to fill at least a portion of the third opening 230h. The third metal layer 141 may be formed by electrolytic plating (or electroplating). The third metal layer 141 may have a thickness, smaller than a thickness of the second metal layer 131 to be formed, in the cross-section.

Figure 5B:
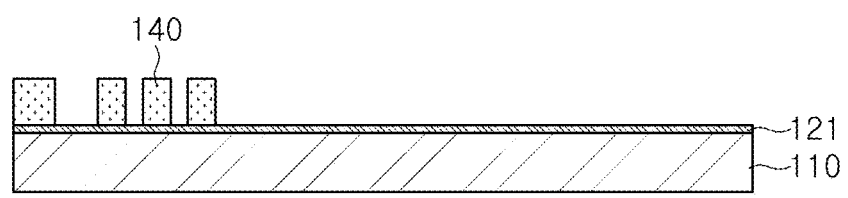

Referring to FIG. 5B, the third resist film 230 may be removed. For example, the third resist film 230 may be removed in a peeling process. When the third resist film 230 is removed, a metal pattern 140 mad of the third metal layer 141 may be formed on the first metal layer 121. The metal pattern 140 may have a thickness, smaller than a thickness of the metal post 130 to be formed, in the cross-section.

Figure 5C:
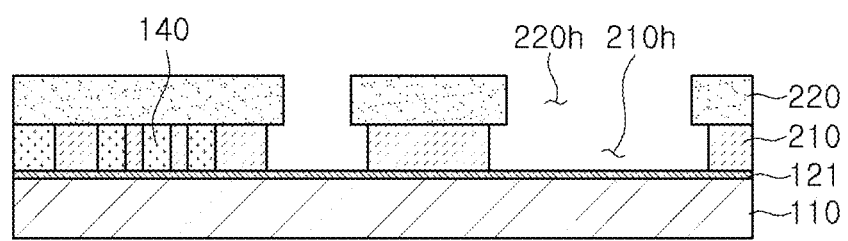

Referring to FIG. 5C, first and second resist films 210 and 220, having first and second openings 210h and 220h exposing the first metal layer 121, may be formed on the first metal layer 121. This will be described with reference to the above-described process of manufacturing a metal post, and duplicate descriptions thereof will be omitted. The first and second resist films 210 and 220 may fill at least a portion of the metal pattern 140. A portion of the metal pattern 140 may be used as a mark for matching when the first and second resist films 210 and 220 are formed.

Figure 5D:
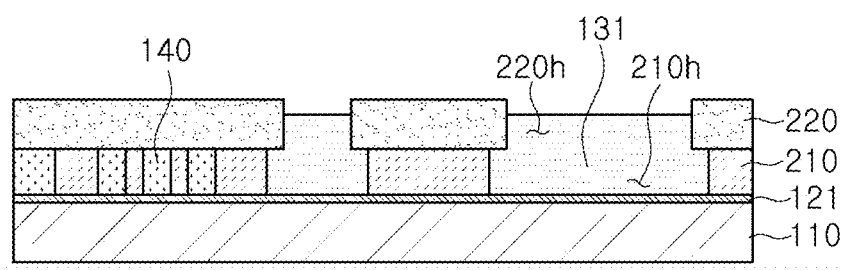

Referring to FIG. 5D, a second metal layer 131 may be formed on the first metal layer 121, exposed through the first and second openings 210h and 220h, to fill at least a portion of each of the first and second openings 210h and 220h. The second metal layer 131 may be formed by electrolytic plating (or electroplating). The second metal layer 131 may simultaneously fill the first and second openings 210h and 220h. The second metal layer 131 may have a thickness, greater than a thickness of the third metal layer 141, in a cross-section.

Figure 5E:
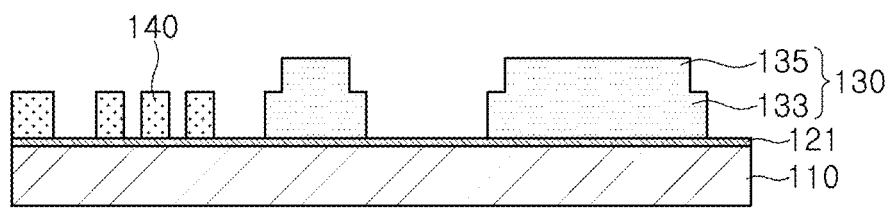

Referring to FIG. 5E, the first and second resist films 210 and 220 may be removed. For example, the first and second resist films 210 and 220 may be removed in a peeling process. When the first and second resist films 210 and 220 are removed, a metal post 130, made of the second metal layer 131 and having a form in which the first and second metal portions 133 and 135 are integrated with each other, may be formed on the first metal layer 121. The metal post 130 may have a thickness, greater than a thickness of the metal pattern 140, in a cross-section.

Figure 5F:
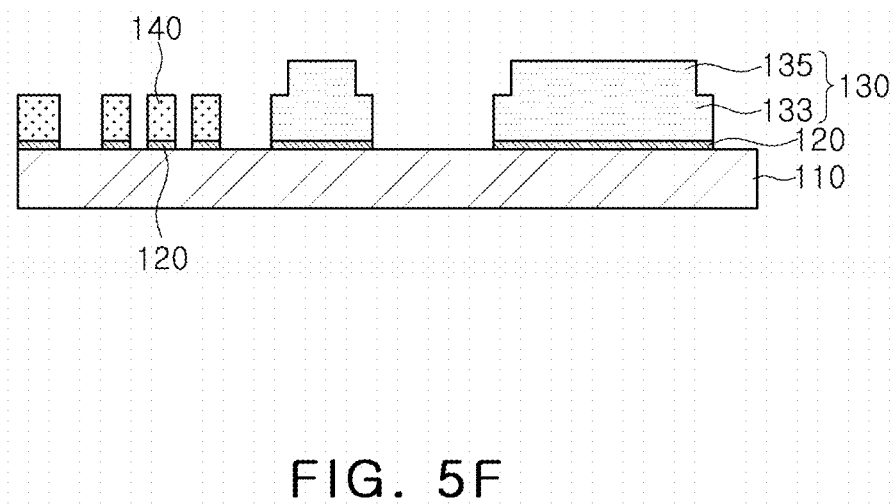

Referring to FIG. 5F, at least a region of the first metal layer 121 may be etched. For example, a region of the first metal layer 121, in which the metal posts 130 and the metal pattern 140 are not formed, may be etched to be removed. As a result, the seed metal layer 120 made of the first metal layer 121 may be formed below the metal post 130 and the metal pattern 140.

The above-described printed circuit board 100A according to an example may be formed through a series of process operations. As described above, when such a process is used, a resist film having a high thickness may be provided through a plurality of resist films to overcome insufficiency of an exposure margin. In addition, after the plurality of resist films are developed, a plurality of metal portions of a metal post may be simultaneously formed by performing a plating process only once, and thus, a matching issue in the related art may also be addressed.

Figure 6:
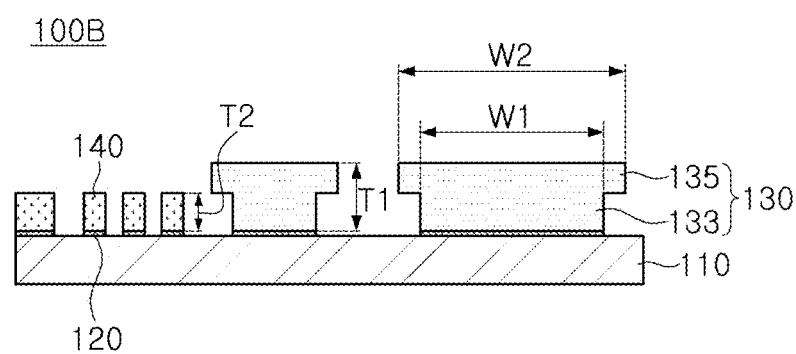
FIG. 6 is a schematic cross-sectional view illustrating another example of a printed circuit board.

FIG. 6 is a schematic cross-sectional view illustrating another example of a printed circuit board.

Referring to FIG. 6, a printed circuit board 100B according to another example may include an insulating layer 110, a seed metal layer 120 disposed on the insulating layer 110, and a metal post 130 including a first metal portion 133 disposed on the seed metal layer 120 and a second metal portion 135 disposed on the first metal portion 133. As necessary, the printed circuit board 100B according to another example may further include a metal pattern 140 disposed on the seed metal layer 120.

The first and second metal portions 133 and 135 of the metal post 130 may be integrated with each other without a boundary, and may have different widths in a cross-section. As another example, a width W1 of the first metal portion 133 in the cross-section may be smaller than a width W2 of the second metal portion 135 in the cross-section. For example, a width of the first metal portion 133 may be rather narrower than a width of the second metal portion 135. When widths in the cross-section are not constant, average widths may be compared with each other. Also, the seed metal layer 120 may be in contact with the first metal portion 133, but may be spaced apart from the second metal portion 135. Due to such a structural feature a risk of mismatch between a metal post and a pad, an issue in the related art, may be addressed.

A thickness T2 of the metal pattern 140 in the cross-section may be smaller than a thickness T1 of the metal post 130 in the cross-section. As described above, the metal pattern 140 may be a microcircuit pattern, and the metal post 130 may be formed by integrating a pad portion of the microcircuit pattern with the post portion. A portion of the metal pattern 140 may be used as a mark for matching a plurality of layers of resist films for forming the metal posts 130.

The second metal portion 135 of the metal post 130 may have a tapered side surface in the cross-section. For example, the second metal portion 135 may have a tapered side surface in which a width of an upper side is greater than a width of a lower side in the cross-section.

Other descriptions, for example, the contents described in the above-described printed circuit board 100A according to an example may be applied to the printed circuit board 100B according to another example as long as the descriptions are not inconsistent, and duplicate descriptions thereof will be omitted.

FIGS. 7A to 7G are schematic process views illustrating an example of manufacturing a metal post of the printed circuit board of FIG. 6.

Figure 7A:
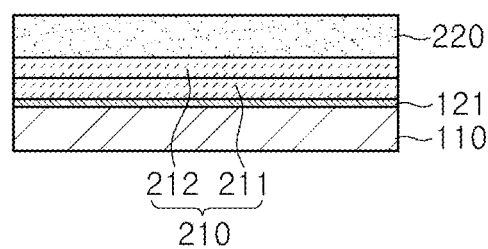
FIGS. 7A to 7G are schematic process views illustrating an example of manufacturing a metal post of the printed circuit board of FIG. 6.

Referring to FIG. 7A, an insulating layer 110, having one surface on which a first metal layer 121 is disposed, may be prepared. The first metal layer 121 may be formed by electroless plating (or chemical plating). Alternatively, the first metal layer 121 may be formed by laminating a copper foil, or the like, on one surface of the insulating layer 110. Next, first and second resist films 210 and 220 may be formed on the first metal layer 121. The first resist film 210 may include a plurality of layers. For example, the first resist film 210 may include a 1-1-th resist film 211 and a 1-2-th resist film 212. In this case, the first and second resist films 210 and 220 may be formed by a triple-laminating method. For example, three dry film resists 211, 212, and 220 may be sequentially laminated on the first metal layer 121, or the three dry film resists 211, 212, and 220 may be laminated in advance using a temporary film and then laminated on the first metal layer 121 together, and the temporary film may be removed. The 1-1-th resist film 211 and the 1-2-th resist film 212 may include a non-photosensitive material, while the second resist film 220 may include a photosensitive material. The 1-1-th resist film 211 and the 1-2-th resist film 212 may be, for example, non-photosensitive films including an acrylic resin, but are not limited thereto. The second resist film 220 may be, for example, a negative-type resist film, but is not limited thereto.

As necessary, the second resist film 220 may include a plurality of layers. For example, the second resist film 220 may include a 2-1-th resist film and a 2-2-th resist film, and the 2-1-th resist film and the 2-2-th resist film may be negative-type photosensitive resist films, but are not limited thereto.

Figure 7B:
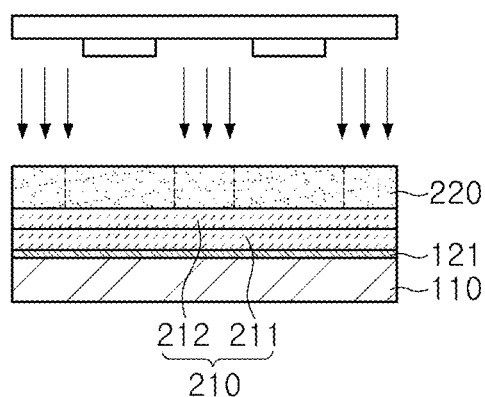

Referring to FIG. 7B, a portion of the second resist film 220 may be exposed. A mask may be used in an exposure process of the second resist film 220. For example, when the second resist film 220 is a negative-type resist film, a region, not covered with the mask, may be partially exposed and selectively cured.

Figure 7C:
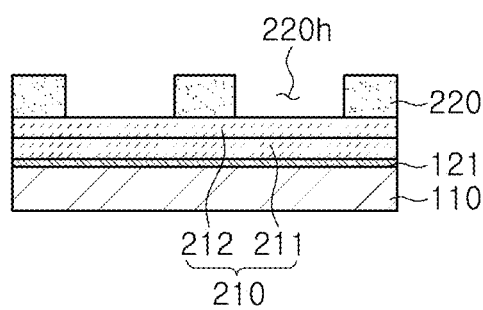

Referring to FIG. 7C, the exposed second resist film 220 may be developed to form a second opening 220h. For example, when the second resist film 220 is a negative-type resist film, the unexposed region may be developed by a development process. As a result of the development, a second opening 220h may be formed. The second opening 220h may have a tapered side surface in a cross-section. For example, the second opening 220h may have a tapered side surface in which a width of an upper side is greater than a width of a lower side in the cross-section. However, example embodiments are not limited thereto.

Figure 7D:
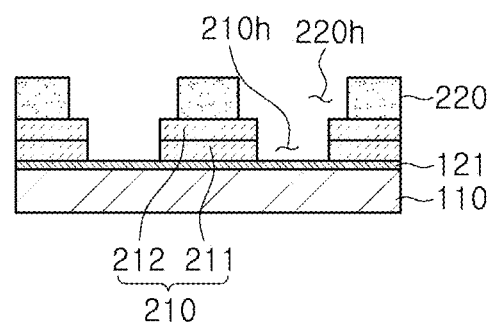

Referring to FIG. 7D, the first resist film 210, exposed through the second opening 220h, may be developed to form a first opening 210h. The first resist film 210 may react only with, for example, sodium carbonate and may control development time to adjust a development area. For example, a width of the first opening 210h may be different from a width of the second opening 220h in a cross-section. For example, the first opening 210h may be formed to have a width narrower than a width of the second opening 220h, in the cross-section, but example embodiments are not limited thereto. When widths in the cross-section are not constant, average widths may be compared with each other.

Figure 7E:
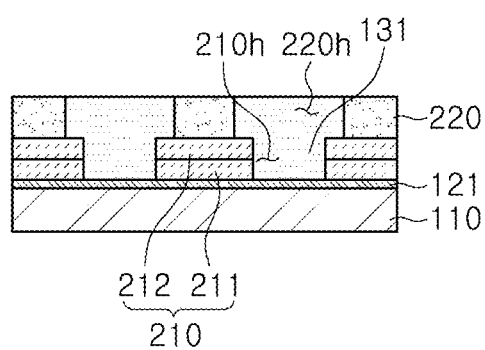

Referring to FIG. 7E, a second metal layer 131 may be formed on the first metal layer 121 exposed through the first and second openings 210h and 220h. The second metal layer 131 may be formed by electrolytic plating (or electroplating). The second metal layer 131 may simultaneously fill the first and second openings 210h and 220h.

Figure 7F:
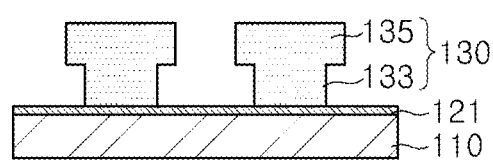

Referring to FIG. 7F, the first and second resist films 210 and 220 may be removed. For example, the first and second resist films 210 and 220 may be removed in a peeling process. When the first and second resist films 210 and 220 are removed, a metal post 130, made of the second metal layer 131 and having a form in which the first and second metal portions 133 and 135 are integrated with each other, may be formed on the first metal layer 121.

Figure 7G:
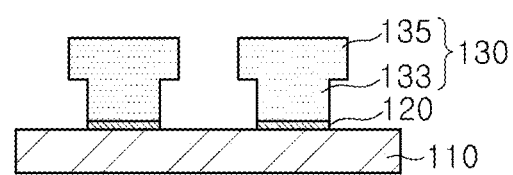

Referring to FIG. 7G, at least a region of the first metal layer 121 may be etched. For example, a region of the first metal layer 121, in which the metal post 130 is not formed, may be etched to be removed. As a result, a seed metal layer 120 made of the first metal layer 121 may be formed between the insulating layer 110 and the metal post 130.

The metal post 130 of the above-described printed circuit board 100B according to another example may be formed through a series of process operations. When such a process is used, a resist film having a high thickness may be provided through a plurality of resist films to overcome insufficiency of an exposure margin. In addition, after the plurality of resist films are developed, a plurality of metal portions of a metal post may be simultaneously formed by performing a plating process only once, and thus, a matching issue in the related art may also be addressed.

Other descriptions, for example, the contents described in the metal post 130 of the above-described printed circuit board 100A according to an example may be applied to the metal post 130 of the printed circuit board 100B according to another example as long as the descriptions are not inconsistent, and duplicate descriptions thereof will be omitted.

FIGS. 8A to 8F are schematic process views illustrating an example of manufacturing the printed circuit board of FIG. 6.

Figure 8A:
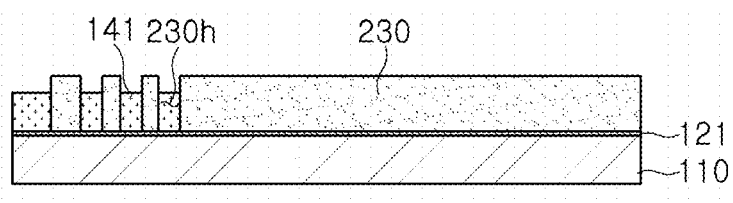
FIGS. 8A to 8F are schematic process views illustrating an example of manufacturing the printed circuit board of FIG. 6.

Referring to FIG. 8A, an insulating layer 110, having one surface on which a first metal layer 121 is disposed, may be prepared, and a third resist film 230, having a third opening 230h exposing the first metal layer 121, may be formed on the first metal layer 121. For example, a third resist film 230 may be formed on the first metal layer 121 by a film lamination method, or the like, a portion of the third resist film 230 may be exposed using a mask, and the exposed third resist film 230 may then be developed to form a third opening 230h. The third resist film 230 may include a photosensitive material and may be, for example, a negative-type resist film, but is not limited thereto. Next, a third metal layer 141 may be formed on the first metal layer 121, exposed through the third opening 230h, to fill at least a portion of the third opening 230h. The third metal layer 141 may be formed by electrolytic plating (or electroplating). The third metal layer 141 may have a thickness, smaller than a thickness of the second metal layer 131 to be formed, in the cross-section.

Figure 8B:
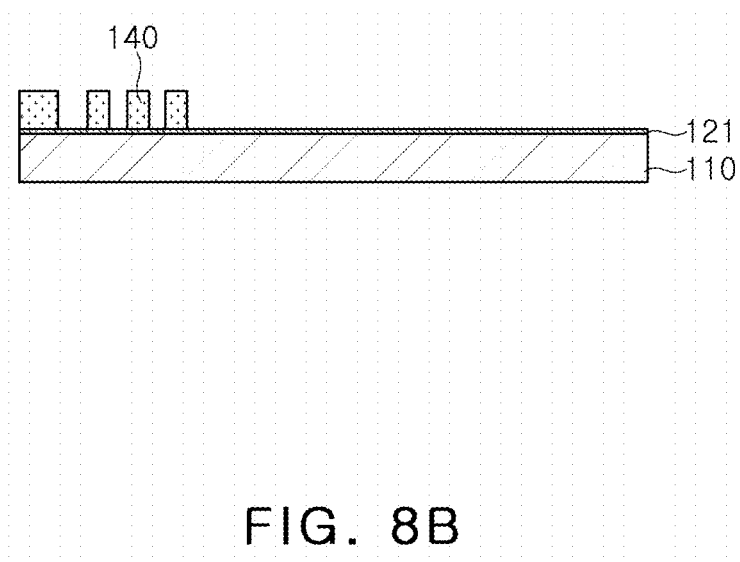

Referring to FIG. 8B, the third resist film 230 may be removed. For example, the third resist film 230 may be removed in a peeling process. When the third resist film 230 is removed, a metal pattern 140 made of the third metal layer 141 may be formed on the first metal layer 121. The metal pattern 140 may have a thickness, smaller than a thickness of the metal post 130 to be formed, in a cross-section.

Figure 8C:
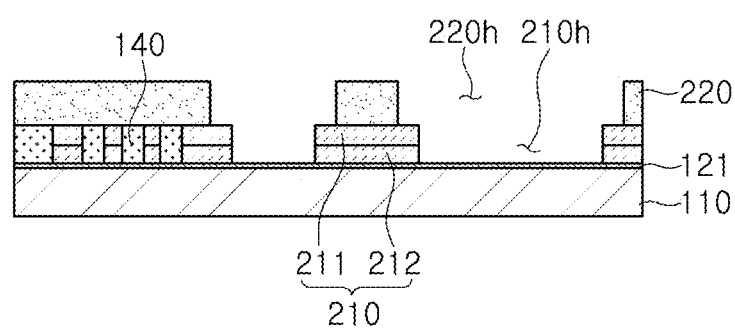

Referring to FIG. 8C, first and second resist films 210 and 220, having first and second openings 210h and 220h exposing the first metal layer 121, may be formed on the first metal layer 121. This will be described with reference to the above-described process of manufacturing a metal post, and duplicate descriptions thereof will be omitted. The first and second resist films 210 and 220 may fill at least a portion of the metal pattern 140. A portion of the metal pattern 140 may be used as a mark for matching when the first and second resist films 210 and 220 are formed.

Figure 8D:
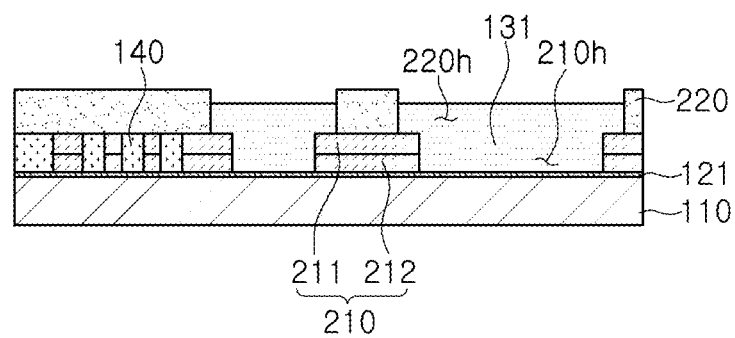

Referring to FIG. 8D, a second metal layer 131 may be formed on the first metal layer 121, exposed through the first and second openings 210h and 220h, to fill at least a portion of each of the first and second openings 210h and 220h. The second metal layer 131 may be formed by electrolytic plating (or electroplating). The second metal layer 131 may simultaneously fill the first and second openings 210*h* and 220*h*. The second metal layer 131 may have a thickness, greater than a thickness of the third metal layer 141, in a cross-section.

Figure 8E:
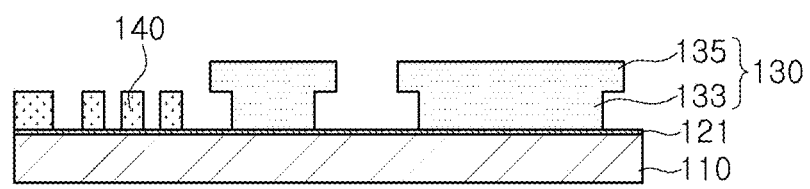

Referring to FIG. 8E, the first and second resist films 210 and 220 may be removed. For example, the first and second resist films 210 and 220 may be removed in a peeling process. When the first and second resist films 210 and 220 are removed, a metal post 130, made of the second metal layer 131 and having a form in which the first and second metal portions 133 and 135 are integrated with each other, may be formed on the first metal layer 121. The metal post 130 may have a thickness, greater than a thickness of the metal pattern 140, in a cross-section.

Figure 8F:
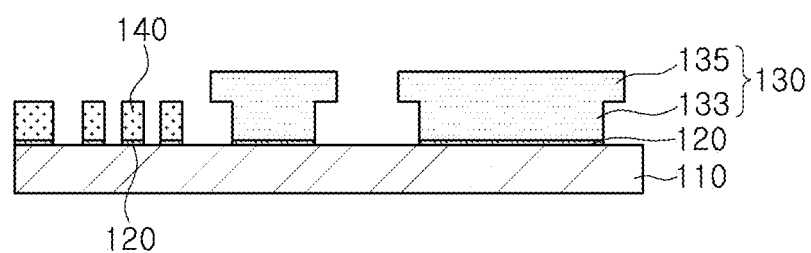

Referring to FIG. 8F, at least a region of the first metal layer 121 may be etched. For example, a region of the first metal layer 121, in which the metal posts 130 and the metal pattern 140 are not formed, may be etched to be removed. As a result, the seed metal layer 120 made of the first metal layer 121 may be formed below the metal post 130 and the metal pattern 140.

The above-described printed circuit board 100B according to an example may be formed through a series of process operations. As described above, when such a process is used, a resist film having a high thickness may be provided through a plurality of resist films to overcome insufficiency of an exposure margin. In addition, after the plurality of resist films are developed, a plurality of metal portions of a metal post may be simultaneously formed by performing a plating process only once, and thus, a matching issue in the related art may also be addressed.

Other descriptions, for example, the contents described in the above-described printed circuit board 100A according to an example may be applied to the printed circuit board 100B according to another example as long as the descriptions are not inconsistent, and duplicate descriptions thereof will be omitted.

Figure 9:
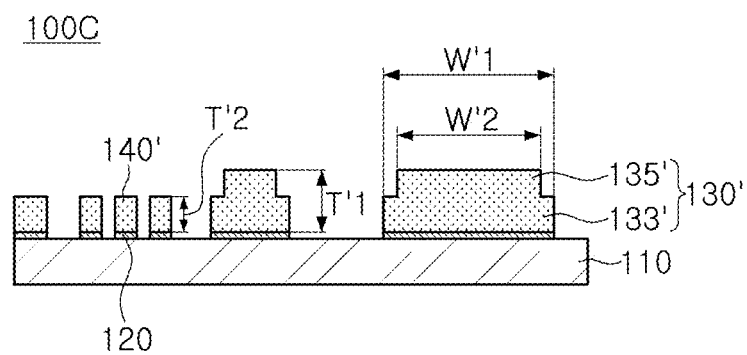
FIG. 9 is a schematic cross-sectional view illustrating another example of a printed circuit board.

FIG. 9 is a schematic cross-sectional view illustrating another example of a printed circuit board.

Referring to FIG. 9, a printed circuit board 100C according to another example may include an insulating layer 110, a seed metal layer 120 disposed on the insulating layer 110, and a metal post 130' including a first metal portion 133' disposed on the seed metal layer 120 and a second metal portion 135' disposed on the first metal portion 133'. As necessary, the printed circuit board 100C according to another example may further include a metal pattern 140' disposed on the seed metal layer 120.

The first and second metal portions 133' and 135' of the metal post 130' may be integrated with each other without a boundary, and may have different widths in a cross-section. As an example, a width W'1 of the first metal portion 133' in the cross-section may be greater than a width W'2 of the second metal portion 135' in the cross-section. When widths in the cross-section are not constant, average widths may be compared with each other. The seed metal layer 120 may be in contact with the first metal portion 133', but may be spaced apart from the second metal portion 135'. Such a structural feature may allow a risk of mismatch between a metal post and a pad, an issue in the related art, to be addressed.

A thickness T'2 of the metal pattern 140' in the cross-section may be smaller than a thickness T'1 of the metal post 130' in the cross-section. As described above, the metal pattern 140' may be a microcircuit pattern, and the metal post 130' may be formed by integrating a pad portion of the microcircuit pattern with a post portion. A portion of the metal pattern 140' may be used as a mark for matching a plurality of layers of a resist film for forming the metal post 130'.

Each of the first and second metal portions 133' and 135' of the metal post 130' may have a tapered side surface in the cross-section. For example, each of the first and second metal portions 133' and 135' may have tapered a side surface in which a width of an upper side is greater than a width of a lower side in the cross-section. As a non-limiting example, a tapered slope of the first metal portion 133' may be greater than a tapered slope of the second metal portion 135'. However, example embodiments are not limited thereto.

Other descriptions, for example, the contents described in the above-described printed circuit board 100A according to an example and the above-described printed circuit board 100B according to another example may be applied to the printed circuit board 100C according to another example as long as the descriptions are not inconsistent, and duplicate descriptions thereof will be omitted.

FIGS. 10A to 10G are schematic process views illustrating an example of manufacturing a metal post of the printed circuit board of FIG. 9.

Figure 10A:
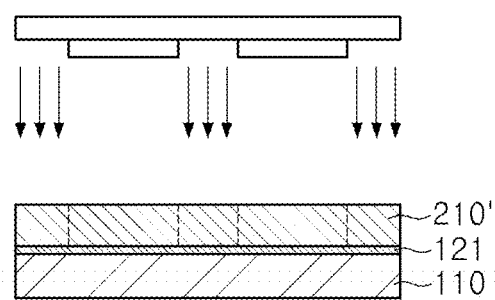
FIGS. 10A to 10G are schematic process views illustrating an example of manufacturing a metal post of the printed circuit board of FIG. 9.

Referring to FIG. 10A, an insulating layer 110, having one surface on which a first metal layer 121 is disposed, may be prepared. The first metal layer 121 may be formed by electroless plating (or chemical plating). Alternatively, the first metal layer 121 may be formed by laminating a copper foil, or the like, on one surface of the insulating layer 110. Next, a first resist film 210' may be formed on the first metal layer 121. The first resist film 210' may be formed by a dry film lamination method, or the like. The first resist film 210' may include a photosensitive material. For example, the first resist film 210' may be a negative-type resist film, but is not limited thereto. Next, a portion of the first resist film 210' may be exposed. A mask may be used in the exposure process of the first resist film 210'. For example, when the first resist film 210' is a negative-type resist film, a region, not covered with the mask, may be partially exposed and selectively cured.

Figure 10B:
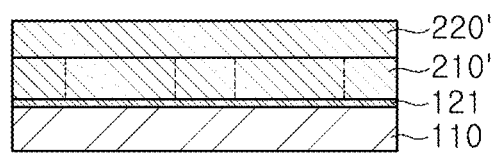

Referring to FIG. 10B, a second resist film 220' may be formed on the exposed first resist film 210'. The second resist film 220' may be formed by a dry film lamination method, or the like. The second resist film 220' may include a photosensitive material. For example, the second resist film 220' may be a negative-type resist film, but is not limited thereto.

Figure 10C:
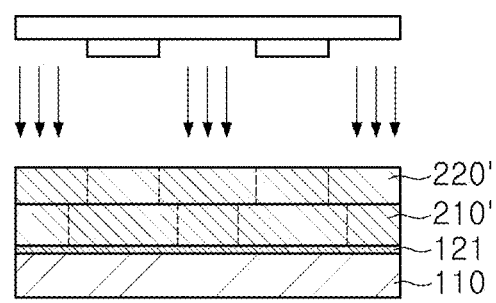

Referring to FIG. 10C, a portion of the second resist film 220' may be exposed. A mask may be used in the exposure process of the second resist film 220'. For example, when the second resist film 220' is a negative-type resist film, a region, not covered with the mask, may be partially exposed and selectively cured. Exposure time of the second resist film 220' may be different from the exposure time of the first resist film 210'. A cured area may be adjusted by controlling the exposure time. As a result, openings 210'*h* and 220'*h* having different widths in a cross-section may be formed in a development process to be described later. For example, the exposure time of the second resist film 220' may be larger than the exposure time of the first resist film 210'. In this case, a cured area of the second resist film 220' may be further increased, so that a width of the first opening 210'*h* may be greater than a width of the second opening 220'*h* in the cross-section after a development process to be described later. In contrast, when the exposure time, or the like, is controlled, a width of the first opening 210'*h* may be narrower than a width of the second opening 220'*h* in the cross-section after the development process to be described later. When widths in the cross-section are not constant, average widths may be compared with each other.

Figure 10D:
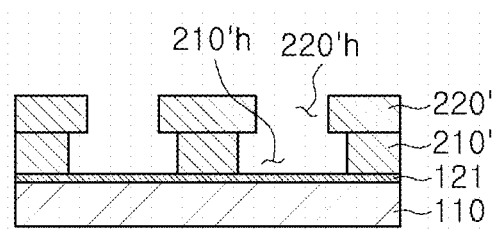

Referring to FIG. 10D, the exposed first and second resist films 210' and 220' may be developed to form first and second openings 210'h and 220'h. For example, when the first and second resist films 210' and 220' are negative-type resist films, an unexposed region may be developed by a development process. As a result of the development, the first and second openings 210'h and 220'h may be formed to expose a first metal layer 121. Each of the first and second openings 210'h and 220'h may have a side surface tapered in a cross-section. For example, each of the first and second openings 210'h and 220'h may have a tapered side surface in which a width of an upper side is greater than a width of a lower side in the cross-section. As a non-limiting example, a tapered slope of the first opening 210'h may be greater than a tapered slope of the second opening 220'h. However, example embodiments are not limited thereto. The first opening 210'h may be formed to have a width, different from a width of the second opening 220'h, in the cross-section. For example, the first opening 210'h may be formed to have a width, greater than a width of the second opening 220'h, in the cross-section, but example embodiments are not limited thereto. When widths in the cross-section are not constant, average widths may be compared with each other.

Figure 10E:
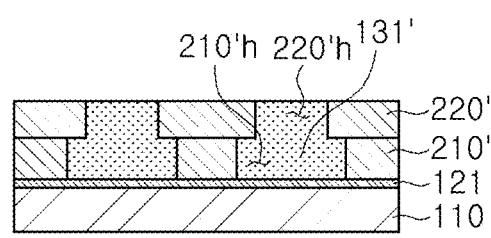

Referring to FIG. 10E, a second metal layer 131' may be formed on the first metal layer 121, exposed through the first and second openings 210'h and 220'h, to fill at least a portion of each of the first and second openings 210'h and 220'h. The second metal layer 131' may be formed by electrolytic plating (or electroplating). The second metal layer 131' may simultaneously fill the first and second openings 210'h and 220'h.

Figure 10F:
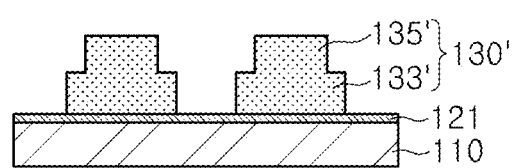

Referring to FIG. 10F, the first and second resist films 210' and 220' may be removed. For example, the first and second resist films 210' and 220' may be removed in a peeling process. When the first and second resist films 210' and 220' are removed, a metal post 130', made of the second metal layer 131' and having a form in which the first and second metal portions 133' and 135' are integrated with each other, may be formed on the first metal layer 121.

Figure 10G:
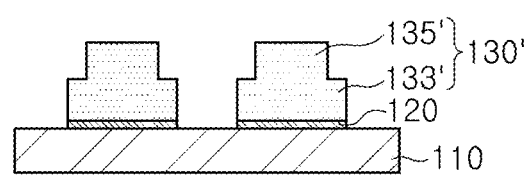

Referring to FIG. 10G, at least a region of the first metal layer 121 may be etched. For example, a region of the first metal layer 121, in which the metal post 130' is not formed, may be etched to be removed. As a result, a seed metal layer 120 made of the first metal layer 121 may be formed between the insulating layer 110 and the metal post 130'.

The metal post 130' of the above-described printed circuit board 100C according to an example may be formed through a series of process operations. As described above, when such a process is used, a resist film having a high thickness may be provided through a plurality of resist films to overcome insufficiency of an exposure margin. In addition, after the plurality of resist films are developed, a plurality of metal portions of a metal post may be simultaneously formed by performing a plating process only once, and thus, a matching issue in the related art may also be addressed.

Other descriptions, for example, the contents described in the metal post 130 of the above-described printed circuit board 100A according to an example and the metal post 130 of the above-described printed circuit board 100B according to another example may be applied to the metal post 130' of the printed circuit board 100C according to another example as long as the descriptions are not inconsistent, and duplicate descriptions thereof will be omitted.

FIGS. 11A to 11F are schematic process views illustrating an example of manufacturing the printed circuit board of FIG. 9.

Figure 11A:
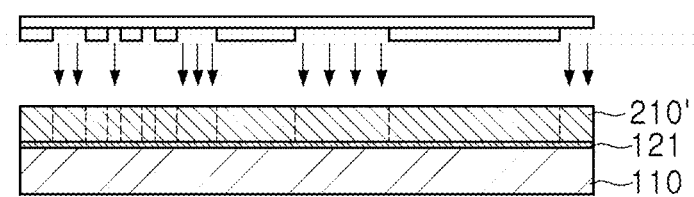
FIGS. 11A to 11F are schematic process views illustrating an example of manufacturing the printed circuit board of FIG. 9.

Referring to FIG. 11A, an insulating layer 110, having one surface on which a first metal layer 121 is disposed, may be prepared. Next, a first resist film 210' may be formed on the first metal layer 121. Next, a portion of the first resist film 210' may be exposed. This will be described with reference to the above-described process of manufacturing a metal post, and duplicate descriptions thereof will be omitted. When a portion of the first resist film 210' is exposed, exposure for not only a first opening 210'h but also a third opening 210''h to be described later may be performed.

Figure 11B:
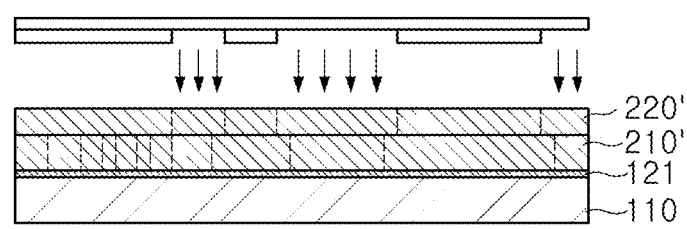

Referring to FIG. 11B, a second resist film 220' may be formed on the exposed first resist film 210'. Next, a portion of the second resist film 220' may be exposed. This will be described with reference to the above-described process of manufacturing a metal post, and duplicate descriptions thereof will be omitted. When a portion of the second resist film 220' is exposed, exposure for not only a second opening 220'h but also a fourth opening 220''h to be described later may be performed.

Figure 11C:
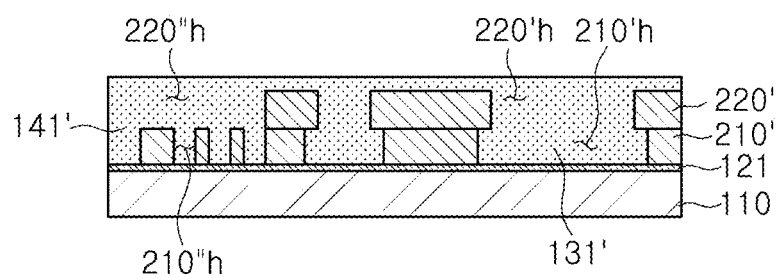

Referring to FIG. 11C, the exposed first and second resist films 210' and 220' may be developed to form first and second openings 210'h and 220'h. This will be described with reference to the above-described process of manufacturing a metal post, and duplicate descriptions thereof will be omitted. When the first and second openings 210'h and 220'h are formed, third and fourth openings 210''h and 220''h may also be formed. For example, the third opening 210''h, penetrating through the first resist film 210' to expose the first metal layer 121, and a fourth opening 220''h, penetrating through the second resist film 220' to expose the third opening 210''h, may be formed by a development process. Next, a second metal layer 131' may be formed on the first metal layer 121, exposed through the first and second openings 210'h and 220'h, to fill at least a portion of each of the first and second openings 210'h and 220'h. This will be described with reference to the above-described process of manufacturing a metal post, and duplicate descriptions thereof will be omitted. When the second metal layer 131' is formed, a third metal layer 141' may also be formed on the first metal layer 121, exposed through the third and fourth openings 210''h and 220''h, to fill at least a portion of each of the third and fourth openings 210''h and 220''h. The second metal layer 131' and the third metal layer 141' may be simultaneously formed by a plating process. Accordingly, the number of processes may be decreased, as compared with a conventional method. A portion of the plating layer may cover an upper surface of the second resist film 220'.

Figure 11D:
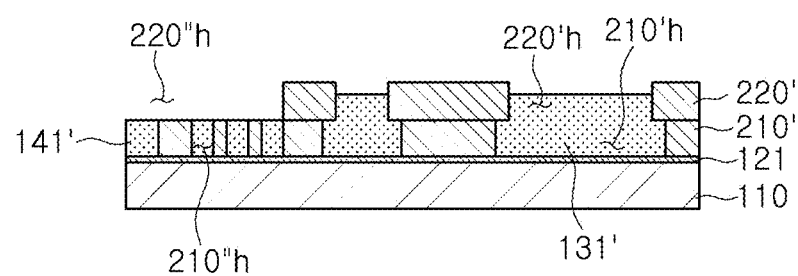

Referring to FIG. 11D, at least a portion of each of the second and third metal layers 131' and 141' may be etched. As the etching, quick etching may be used, and a portion of the plating layer may be removed through the etching. The etching may cause a thickness of the third metal layer 141' in the cross-section to be smaller than a thickness of the second metal layer 131' in the cross-section.

Figure 11E:
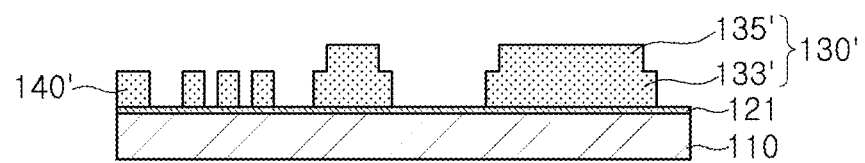

Referring to FIG. 11E, the first and second resist films 210' and 220' may be removed. This will be described with reference to the above-described process of manufacturing a metal post, and duplicate descriptions thereof will be omitted. As a result, a metal pattern 130', made of the second metal layer 131' and having a form in which the first and second metal portions 133' and 135' are integrated with each other, and a metal pattern 140', made of the third metal layer 141' and having a thickness smaller than a thickness of the metal post 130', may be formed on the first metal layer 121.

Figure 11F:
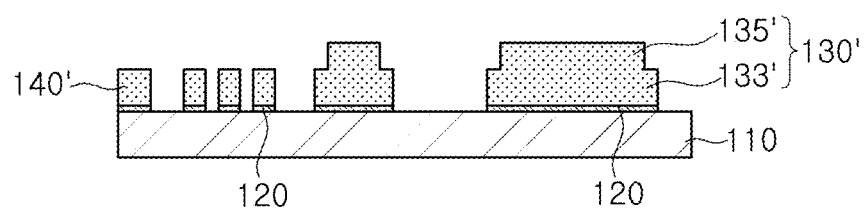

Referring to FIG. 11F, at least a region of the first metal layer 121 may be etched. For example, a region of the first metal layer 121, in which the metal posts 130' and the metal patterns 140' are not formed, may be etched to be removed. As a result, a seed metal layer 120 made of the first metal layer 121 may be formed below the metal posts 130' and the metal patterns 140'.

The above-described printed circuit board 100C according to another example may be formed through a series of process operations. When such a process is used, a resist film having a high thickness may be provided through a plurality of resist films to overcome insufficiency of an exposure margin. In addition, after the plurality of resist films are developed, a plurality of metal portions of a metal post may be simultaneously formed by performing a plating process only once, and thus, a matching issue in the related art may also be addressed.

As described above, example embodiments may provide a printed circuit board, capable of suppressing a risk of mismatch between a metal post and a pad, and a method of manufacturing the same.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present invention as defined by the appended claims.

What is claimed is:

1. A method of manufacturing a printed circuit board, the method comprising:
    forming first and second resist films, respectively having first and second openings exposing a first metal layer disposed on one surface of an insulating layer;
    forming a second metal layer on the first metal layer, exposed through the first and second openings, to fill at least a portion of each of the first and second openings; and
    removing the first and second resist films,
    wherein
    the first and second openings have different widths in a cross-section, and
    the width of the first opening is greater than the width of the second opening, and the first resist film is disposed between the first metal layer and the second resist film.

2. The method of claim 1, wherein
    the first resist film includes a non-photosensitive material, and
    the second resist film includes a photosensitive material.

3. The method of claim 2, wherein
    the forming the first and second resist films, respectively having the first and second openings, comprises:
        forming the first and second resist films on the first metal layer;
        exposing a portion of the second resist film;
        developing the exposed second resist film to form the second opening; and
        developing the first resist film, exposed through the second opening, to form the first opening.

4. The method of claim 2, wherein
    at least one of the first and second resist films includes a plurality of layers.

5. The method of claim 2, before forming the first and second resist films, respectively having the first and second openings, further comprising:
    forming a third resist film, having a third opening exposing the first metal layer, on the first metal layer;
    forming a third metal layer on the first metal layer, exposed through the third opening, to fill at least a portion of the third opening; and
    removing the third resist film,
    wherein
    the third metal layer has a thickness, less than a thickness of the second metal layer, in the cross-section.

6. The method of claim 5, wherein
    the forming the third resist film having the third opening comprises:
        forming the third resist film on the first metal layer;
        exposing a portion of the third resist film; and
        developing the exposed third resist film to form the third opening.

7. The method of claim 1, wherein
    each of the first and second resist films includes a photosensitive material.

8. The method of claim 7, wherein
    the forming the first and second resist films, respectively having the first and second openings, comprises:
        forming the first resist film on the first metal layer;
        exposing a portion of the first resist film;
        forming the second resist film on the exposed first resist film;
        exposing a portion of the second resist film; and developing the exposed first and second resist films to form the first and second openings.

9. The method of claim 8, wherein
in the developing the exposed first and second resist films to form the first and second openings, a third opening exposing the first metal layer through the first resist film and a fourth opening exposing the third opening through the second resist film are further formed, and
in the forming the second metal layer, a third metal layer is further formed on the first metal layer, exposed through the third and fourth openings, to fill at least a portion of each of the third and fourth openings.

10. The method of claim 9, after the forming the second and third metal layers, further comprising:
etching at least a portion of each of the second and third metal layers,
wherein
the third metal layer has a thickness, smaller than a thickness of the second metal layer, in the cross-section.

11. The method of claim 1, after the removing the first and second resist films, further comprising:
etching at least a region of the first metal layer.

12. A method of manufacturing a printed circuit board, the method comprising:
forming first and second resist films, respectively having first and second openings exposing a first metal layer disposed on one surface of an insulating layer;
forming a second metal layer on the first metal layer, exposed through the first and second openings, to fill at least a portion of each of the first and second openings; and
removing the first and second resist films,
wherein
the first and second openings have different widths in a cross-section, and
the width of the first opening is less than the width of the second opening, and the first resist film is disposed between the first metal layer and the second resist film.

13. A printed circuit board comprising:
an insulating layer;
a seed metal layer disposed on the insulating layer; and
a metal post including a first metal portion, disposed on the seed metal layer, and a second metal portion disposed on the first metal portion,
wherein
the first and second metal portions are integrated with each other without a boundary therebetween,
the first and second metal portions have different widths in a cross-section, and the seed metal layer is in contact with the first metal portion, but is spaced apart from the second metal portion,
the first metal portion is a bottommost portion of the metal post, and the first metal portion and a portion of the seed metal layer that contacts the first metal portion have the same width.

14. The printed circuit board of claim 13, further comprising:
a metal pattern disposed on the seed metal layer,
wherein
the metal pattern has a thickness, smaller than a thickness of the metal post, in the cross-section.

15. The printed circuit board of claim 13, wherein
the width of the first metal portion is greater than the width of the second metal portion, in the cross-section.

16. The printed circuit board of claim 13, wherein
the width of the first metal portion is narrower than the width of the second metal portion, in the cross-section.

* * * * *